US 9,087,817 B2

(12) United States Patent
Michikoshi et al.

(10) Patent No.: US 9,087,817 B2
(45) Date of Patent: Jul. 21, 2015

(54) SEMICONDUCTOR DEVICE INCLUDING A GATE WIRING CONNECTED TO AT LEAST ONE SEMICONDUCTOR CHIP

(71) Applicant: Sumitomo Electric Industries, Ltd., Osaka-shi (JP)

(72) Inventors: Hisato Michikoshi, Osaka (JP); Noriyuki Hirakata, Osaka (JP); Hiroshi Notsu, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 161 days.

(21) Appl. No.: 13/901,103

(22) Filed: May 23, 2013

(65) Prior Publication Data

US 2014/0001481 A1 Jan. 2, 2014

Related U.S. Application Data

(60) Provisional application No. 61/665,761, filed on Jun. 28, 2012.

(30) Foreign Application Priority Data

Jun. 28, 2012 (JP) ................................. 2012-145146

(51) Int. Cl.
*H01L 23/48* (2006.01)
*H01L 23/495* (2006.01)
(Continued)

(52) U.S. Cl.
CPC .......... *H01L 23/48* (2013.01); *H01L 23/49531* (2013.01); *H01L 23/49562* (2013.01); *H01L 23/49575* (2013.01); *H01L 24/49* (2013.01); *H01L 23/3107* (2013.01); *H01L 24/45* (2013.01); *H01L 24/48* (2013.01); *H01L 2224/45014* (2013.01); *H01L 2224/45124* (2013.01); *H01L 2224/45144* (2013.01);
(Continued)

(58) Field of Classification Search
CPC ............... H01L 23/49575; H01L 2224/45014; H01L 2924/13091
See application file for complete search history.

(56) References Cited

U.S. PATENT DOCUMENTS

2003/0062608 A1* 4/2003 Hamachi ........................ 257/676

FOREIGN PATENT DOCUMENTS

JP    2003-110077 A    4/2003
JP    2004-134460 A    4/2004
(Continued)

OTHER PUBLICATIONS

International Search Report and Written Opinion in PCT International Application No. PCT/JP2013/063444, dated Aug. 13, 2013.
(Continued)

*Primary Examiner* — Thanh V Pham
(74) *Attorney, Agent, or Firm* — Venable LLP; Michael A. Sartori; Tamatane J. Aga

(57) ABSTRACT

A semiconductor device includes at least one semiconductor chip, a gate wiring connected to the at least one semiconductor chip, a first wiring connected to the at least one semiconductor chip, and a second wiring connected to the at least one semiconductor chip. The first and second wirings extend along the gate wiring. The first wiring is arranged between the gate wiring and second wiring. The first wiring is the wiring closest to the gate wiring. A first part of the gate wiring opposing the first wiring is shorter than a second part of the gate wiring opposing the second wiring.

4 Claims, 6 Drawing Sheets

(51) Int. Cl.
  *H01L 23/31* (2006.01)
  *H01L 23/00* (2006.01)

(52) U.S. Cl.
  CPC ........ *H01L 2224/45147* (2013.01); *H01L 2224/48195* (2013.01); *H01L 2224/48247* (2013.01); *H01L 2224/49111* (2013.01); *H01L 2224/49175* (2013.01); *H01L 2924/12032* (2013.01); *H01L 2924/1305* (2013.01); *H01L 2924/13055* (2013.01); *H01L 2924/13091* (2013.01); *H01L 2924/19107* (2013.01); *H01L 2924/30107* (2013.01)

(56) References Cited

FOREIGN PATENT DOCUMENTS

| | | |
|---|---|---|
| JP | 2004-273749 A | 9/2004 |
| JP | 2004-342735 A | 12/2004 |
| JP | 4746061 B2 | 8/2011 |
| WO | WO-2010/004802 A1 | 1/2010 |

OTHER PUBLICATIONS

International Preliminary Report on Patentability and Written Opinion in PCT International Application No. PCT/JP2013/063444, dated Dec. 31, 2014.

* cited by examiner

*Fig.2*

|  | Distance [mm] | Mutual inductance [nH] | Current [A] | Fluctuation in gate voltage [V] |
| --- | --- | --- | --- | --- |
| P1 | 3.72 | 0.22 | 12.5 | 0.14 |
| P2 | 2.11 | 0.43 | 12.5 | 0.27 |
| P3 | 0.89 | 0.49 | 12.5 | 0.31 |
| P4 | 2.49 | 0.26 | 12.5 | 0.16 |
| P5 | 4.14 | 0.17 | 12.5 | 0.11 |
| P6 | 5.37 | 0.10 | 12.5 | 0.06 |
| P7 | 8.05 | 0.08 | 12.5 | 0.05 |
| P8 | 8.91 | 0.06 | 12.5 | 0.04 |
| Total |  | 1.81 | 100 | 1.14 |

*Fig.4*

|  | Distance [mm] | Mutual inductance [nH] | Current [A] | Fluctuation in gate voltage [V] |
|---|---|---|---|---|
| P11 | 4.54 | 0.10 | 12.5 | 0.07 |
| P12 | 3.52 | 0.13 | 12.5 | 0.08 |
| P13 | 0.45 | 0.65 | 12.5 | 0.41 |
| P14 | 0.45 | 0.65 | 12.5 | 0.41 |
| P15 | 3.52 | 0.13 | 12.5 | 0.08 |
| P16 | 4.54 | 0.10 | 12.5 | 0.07 |
| P17 | 7.36 | 0.07 | 12.5 | 0.04 |
| P18 | 8.34 | 0.06 | 12.5 | 0.04 |
| Total |  | 1.90 | 100 | 1.19 |

SEMICONDUCTOR DEVICE INCLUDING A GATE WIRING CONNECTED TO AT LEAST ONE SEMICONDUCTOR CHIP

CROSS-REFERENCE RELATED APPLICATIONS

This application claims priority to Provisional Application Ser. No. 61/665,761, filed on Jun. 28, 2012 and claims the benefit of Japanese Patent Application No. 2012-145146, filed on Jun. 28, 2012, all of which are incorporated herein by reference in their entirety.

BACKGROUND

1. Field

The present invention relates to a semiconductor device.

2. Related Background

Known as an example of semiconductor devices is one equipped with a semiconductor chip of MOSFET (see Japanese Patent Publication No. 4746061). In such a semiconductor device, a semiconductor chip mounted on a die pad is connected to a gate lead through a gate wire and to a source lead through a plurality of source wires.

SUMMARY

In the above-mentioned semiconductor, the source wire closest to the gate wire has a length identical to or longer than that of the other source wires. Therefore, when currents flowing through a plurality of source wires vary with time, the gate wire is more susceptible to mutual inductances received from a plurality of source wires because of an electromagnetic effect. As a result, the gate voltage applied to the gate wire fluctuates more with time in the above-mentioned semiconductor device.

It is an object of the present invention to provide a semiconductor device which can inhibit the gate voltage from fluctuating with time.

The semiconductor device in accordance with one aspect of the present invention comprises at least one semiconductor chip, a gate wiring connected to the at least one semiconductor chip, a first wiring connected to the at least one semiconductor chip, and a second wiring connected to the at least one semiconductor chip, wherein the first and second wirings extend along the gate wiring, wherein the first wiring is arranged between the gate wiring and second wiring, wherein the first wiring is the wiring closest to the gate wiring, and wherein a first part of the gate wiring opposing the first wiring is shorter than a second part of the gate wiring opposing the second wiring. The first part of the gate wiring may be a part located at an intersection between the gate wiring and a perpendicular drawn from a given point of the first wiring to the gate wiring. The second part of the gate wiring may be a part located at an intersection between the gate wiring and a perpendicular drawn from a given point of the second wiring to the gate wiring.

When currents flowing through the first and second wirings vary with time, the gate wiring is susceptible to mutual inductances received from the first and second wirings because of the electromagnetic effect. As a result, the gate voltage of the semiconductor chip fluctuates with time. The mutual inductances are determined by the distances between the gate wiring and the first and second wirings and the lengths of the parts of the gate wiring opposing the first and second wirings. As the distances between the gate wiring and the first and second wirings are shorter, the mutual inductances become greater. As the lengths of the parts of the gate wiring opposing the first and second wirings are longer, the mutual inductances become greater.

In the semiconductor device, the length d1 of the first part of the gate wiring opposing the first wiring closest to the gate wiring is shorter than the length d2 of the second part of the gate wiring opposing the second wiring. Therefore, the mutual inductance received by the gate wiring from the first wiring because of the electromagnetic effect is smaller, whereby the gate voltage is inhibited from fluctuating with time.

The at least one semiconductor chip may comprise a plurality of semiconductor chips; the plurality of semiconductor chips may be arranged along a first direction; and, with respect to an axis extending along a second direction perpendicular to the first direction between the semiconductor chips adjacent to each other, the gate wiring, first wiring, and second wiring on one side may be arranged in the reverse of those on the other side.

This uniformizes influences of mutual inductances received by the gate wirings of semiconductor chips from the first and second wirings because of the electromagnetic effect, thereby reducing fluctuations in gate voltage between the semiconductor chips adjacent to each other.

The at least one semiconductor chip may be made of a material containing a wide bandgap semiconductor.

This allows a greater current to flow through the first and second wirings than in a semiconductor chip made of silicon. Therefore, the gate voltage tends to fluctuate more with time in the wide bandgap semiconductor, which yields a greater effect by inhibiting the gate voltage from fluctuating with time.

The semiconductor device may further comprise a wiring pattern connected to the gate wiring.

In this case, setting the distance between the semiconductor chip and the wiring pattern smaller can reduce the length of the gate wiring. This makes the gate wiring less susceptible to the mutual inductances received from the first and second wirings because of the electromagnetic effect, thereby further restraining the gate voltage from fluctuating with time.

The semiconductor device may further comprise a first lead electrically connected to the gate wiring, a second lead electrically connected to the first and second wirings, and a die pad having a chip mount surface for mounting the at least one semiconductor chip.

It is typically difficult for a semiconductor device equipped with a lead to separate the gate wiring sufficiently from the first and second wirings. Therefore, the gate voltage tends to fluctuate more with time in the semiconductor device equipped with the lead, which yields a greater effect by inhibiting the gate voltage from fluctuating with time.

As mentioned above, a semiconductor device which can inhibit the gate voltage from fluctuating with time can be provided.

BRIEF DESCRIPTION OF THE DRAWINGS

FIG. 1 is a plan view schematically illustrating the semiconductor device in accordance with a first embodiment;

FIG. 2 is a chart illustrating an example of fluctuations in gate voltage with time in the semiconductor device in accordance with the first embodiment;

FIG. 3 is a plan view schematically illustrating a semiconductor device for reference;

FIG. 4 is a chart illustrating an example of fluctuations in gate voltage with time in the semiconductor device for reference;

Figure 5:
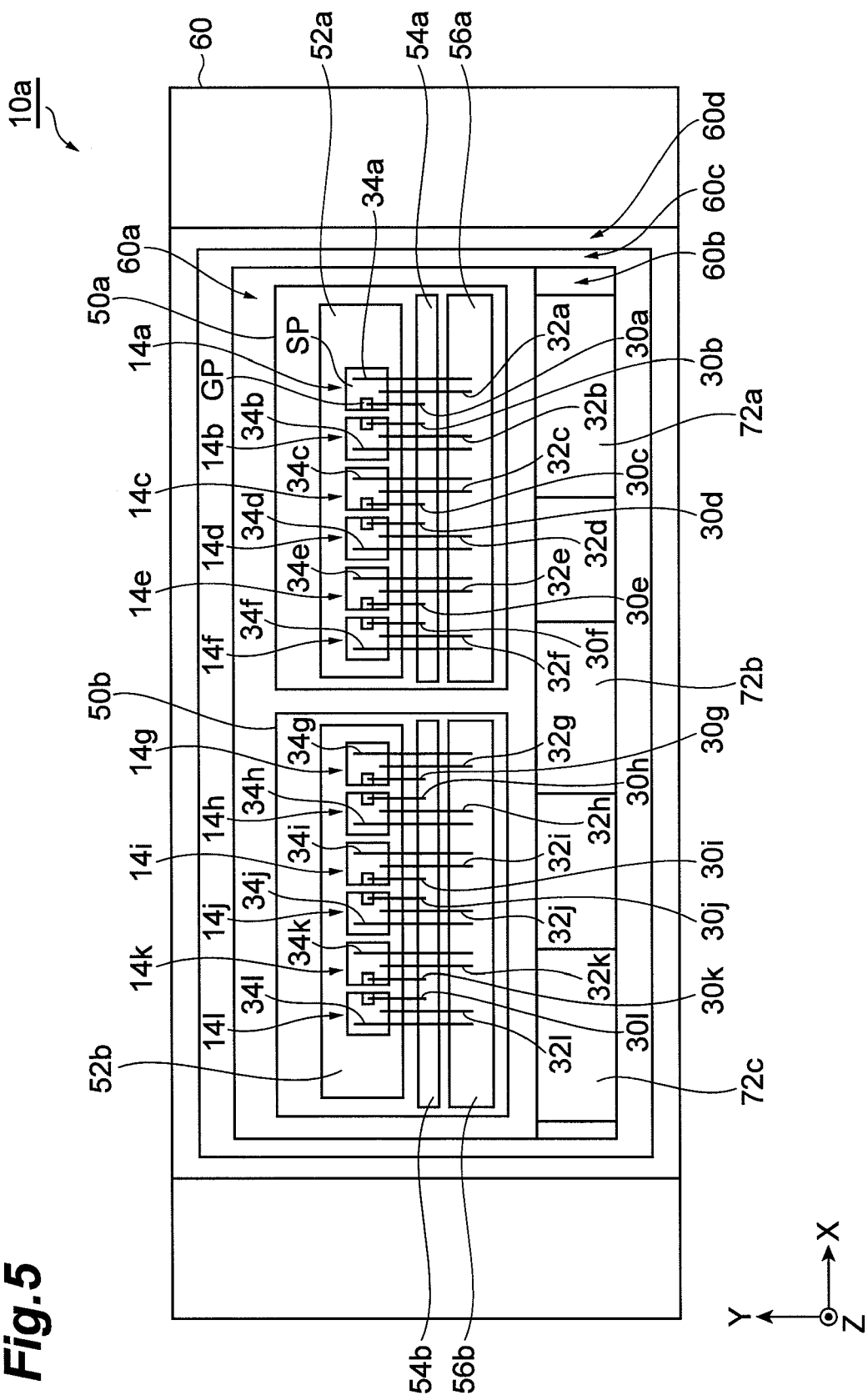
Figure 6:
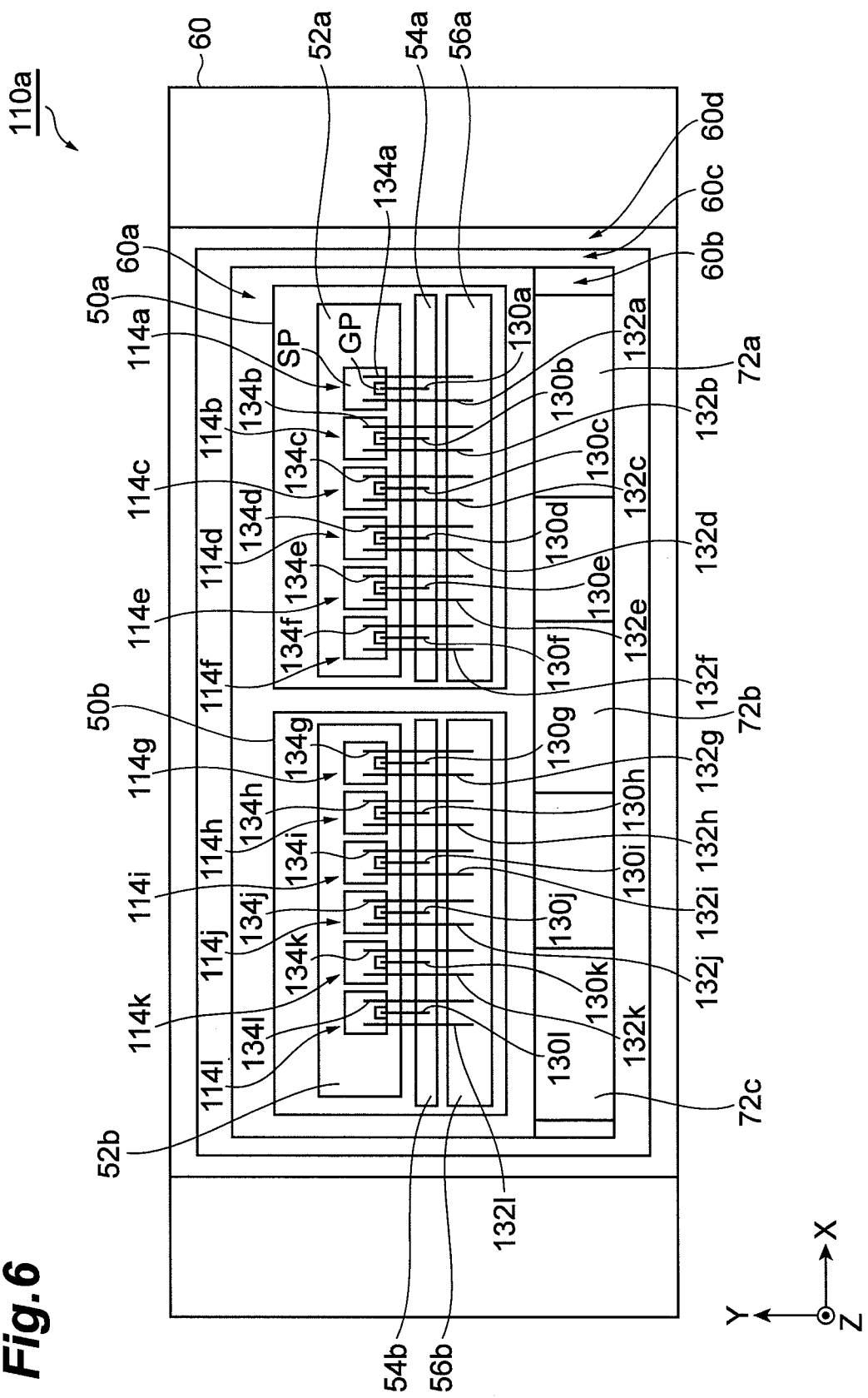

FIG. 5 is a plan view schematically illustrating the semiconductor device in accordance with a second embodiment; and FIG. 6 is a plan view schematically illustrating a semiconductor device for reference.

DETAILED DESCRIPTION

In the following, embodiments of the present invention will be explained in detail with reference to the accompanying drawings. In the explanation of the drawings, the same or equivalent constituents will be referred to with the same signs while omitting their overlapping descriptions. FIGS. 1, 3, 5, and 6 illustrate XYZ orthogonal coordinate systems.

First Embodiment

Figure 1:
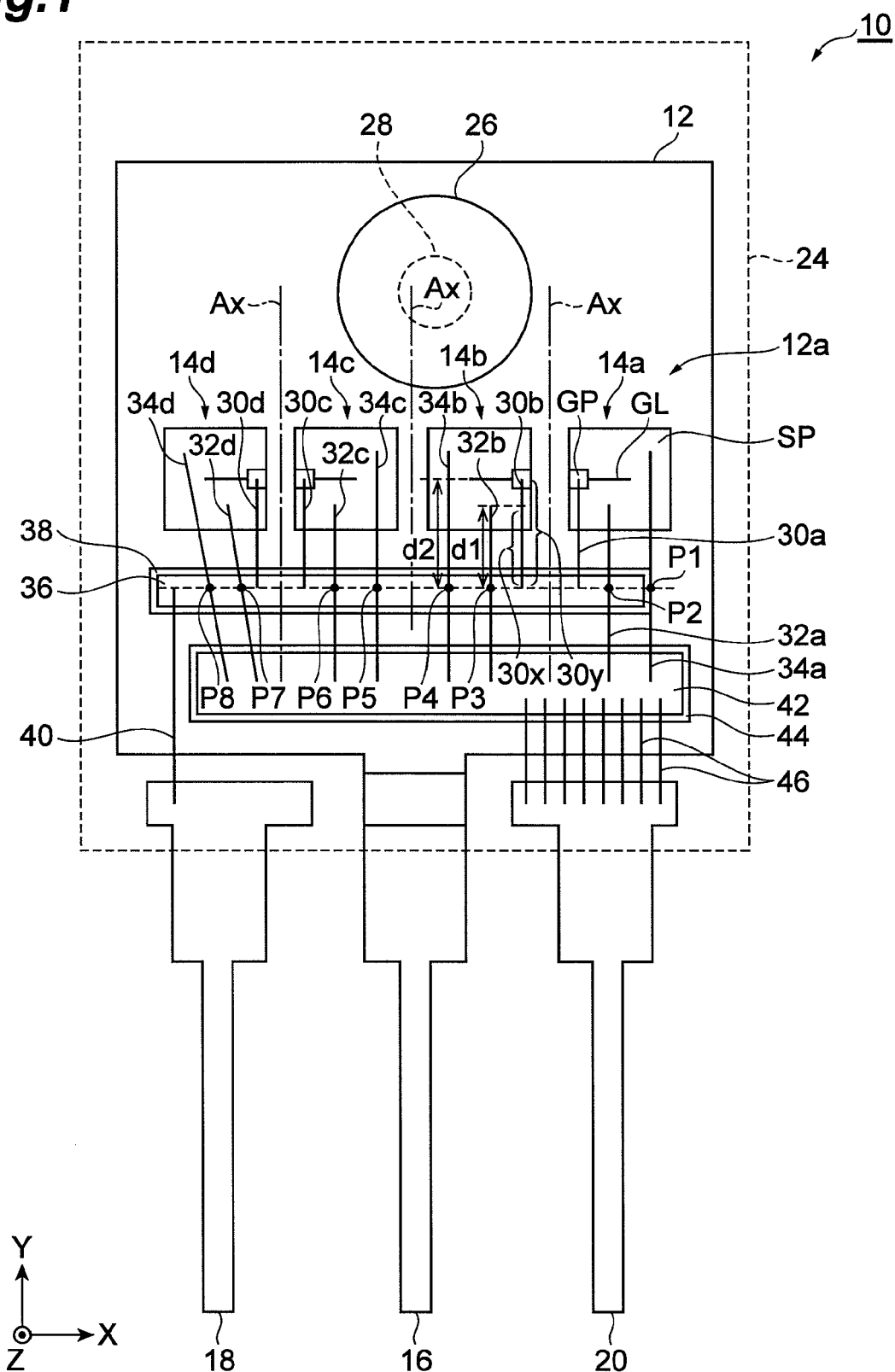

FIG. 1 is a plan view schematically illustrating the semiconductor device in accordance with the first embodiment. The semiconductor device 10 illustrated in FIG. 1 is a semiconductor device of a resin seal type. The semiconductor device 10 comprises a plurality of semiconductor chips 14a to 14d. The semiconductor chips 14a to 14d may be connected in parallel.

The semiconductor device 10 may be equipped with a die pad 12 having a chip mount surface 12a for mounting the semiconductor chips 14a to 14d. The die pad 12 may be electrically connected to the semiconductor chips 14a to 14d. The die pad 12 is formed into a plate, for example. The chip mount surface 12a is rectangular, for example. Examples of materials for the die pad 12 include metals such as copper (Cu) and copper alloys. The die pad 12 may be formed with a through hole 26 which penetrates therethrough in the thickness direction. The through hole 26 is a hole for inserting therethrough a screw, for example, when securing the semiconductor device 10 to another member (e.g., heatsink) with the screw.

The semiconductor chips 14a to 14d are mounted on the chip mount surface 12a at predetermined positions. Examples of the semiconductor chips 14a to 14d include transistors such as bipolar transistors, MOS-FET, and insulated gate bipolar transistors (IGBT) and diodes such as pn-junction diodes and Schottky barrier diodes. The semiconductor chips 14a to 14d can be mounted on the chip mount surface 12a with a bonding layer constituted by a material including leaded metal solder, lead-free metal solder, a conductive resin, or the like. Examples of materials for the semiconductor chips 14a to 14d include wide bandgap semiconductors and other semiconductors such as silicon. The wide bandgap semiconductors have a bandgap greater than that of silicon. Examples of the wide bandgap semiconductors include silicon carbide (SiC), gallium nitride (GaN), and diamond.

Each of the semiconductor chips 14a to 14d may have a gate electrode pad GP and an electrode pad SP. The gate electrode pad GP may be formed at an end part on a main face of the semiconductor chips 14a to 14d. A gate liner GL may be connected to the gate electrode pad GP. The electrode pad SP may be formed in a region free of the gate electrode pad GP and gate liner GL on the main face of the semiconductor chips 14a to 14d.

When the semiconductor chips 14a to 14d include a MOS-FET, the electrode pad SP corresponds to a source electrode pad. When the semiconductor chips 14a to 14d include an IGBT, the electrode pad SP corresponds to an emitter electrode pad. The whole rear face of the semiconductor chip 14a to 14d may be formed with another electrode pad such as a drain electrode pad or collector electrode pad, for example.

A gate wiring 30a, a first wiring 32a, and a second wiring 34a are connected to the semiconductor chip 14a. The gate wiring 30a may be connected to the gate electrode pad GP of the semiconductor chip 14a. The first wiring 32a and second wiring 34a may be connected to the electrode pad SP of the semiconductor chip 14a. Similarly, gate wirings 30b to 30d may be connected to the gate electrode pads GP of the semiconductor chips 14b to 14d, respectively. First wirings 32b to 32d may be connected to the electrode pads SP of the semiconductor chips 14b to 14d, respectively. Second wirings 34b to 34d may be connected to the electrode pads SP of the semiconductor chips 14b to 14d, respectively. The first wirings 32a to 32d and second wirings 34a to 34d are wirings for supplying currents to the semiconductor chips 14b to 14d. The gate wirings 30a to 30d are wirings for switching the currents flowing through the first wirings 32a to 32d and second wirings 34a to 34d. The first wirings 32a to 32d and second wirings 34a to 34d may be arranged dispersedly on the electrode pad SP in order to inhibit currents from concentrating.

The first wirings 32a to 32d and second wirings 34a to 34d extend along the gate wirings 30a to 30d. The gate wirings 30a to 30d, first wirings 32a to 32d, and second wirings 34a to 34d may extend along the XY plane. The first wirings 32a to 32d are arranged between the gate wirings 30a to 30d and second wirings 34a to 34d. For example, the first wiring 32a is arranged between the gate wiring 30a and second wiring 34a. The first wirings 32a to 32d are the wirings closest to the gate wirings 30a to 30d, respectively. The length d1 of a first part 30x of the gate wirings 30a to 30d opposing the first wirings 32a to 32d is shorter than the length d2 of a second part 30y of the gate wirings 30a to 30d opposing the second wirings 34a to 34d. The length d2 may be 1.2 times or more that of the length d1. The lengths d1 and d2 may be measured by seeing the first wirings 32a to 32d and second wirings 34a to 34d in the Z direction perpendicular to the main faces of the semiconductor chips 14a to 14d. The first part 30x of the gate wirings 30a to 30d may be a part located at an intersection between the gate wirings 30a to 30d and a perpendicular drawn from a given point of the first wirings 32a to 32d to the gate wirings 30a to 30d. The second part 30y of the gate wirings 30a to 30d may be a part located at an intersection between the gate wirings 30a to 30d and a perpendicular drawn from a given point of the second wirings 34a to 34d to the gate wirings 30a to 30d.

The semiconductor chips 14a to 14d may be arranged along the X direction (first direction). Arranged between the semiconductor chips 14a to 14d adjacent to each other is an axis Ax extending along the Y direction (second direction perpendicular to the first direction). With respect to the axis Ax, the gate wirings 30a to 30d, first wirings 32a to 32d, and second wirings 34a to 34d on one side may be arranged in the reverse of those on the other side. With respect to the axis Ax, the gate electrode pad GP and electrode pad SP on one side may also be arranged in the reverse of those on the other side. For example, the gate wiring 30a may be arranged at a position symmetrical to that of the gate wiring 30b with respect to the axis Ax.

The semiconductor device 10 may comprise a first lead 18, a second lead 20, and a third lead 16. The leads 16, 18, 20, each extending along the Y direction, are arranged in a row along the X direction. The lead 16 is located between the leads 18, 20. The leads 16, 18, 20 and die pad 12 may construct a lead frame. The semiconductor device 10 is a power semiconductor device used for a power supply or the like, for example. Examples of package forms for the semiconductor device 10 include typical TO series. Examples of the TO series include TO-247, TO-220, TO-263 (D2-PAK), and TO-252 (D-PAK).

The lead 18 is electrically connected to the gate wirings 30a to 30d. The lead 20 is electrically connected to the first wirings 32a to 32d and second wirings 34a to 34d. An inner end part of the lead 16 is mechanically integrally joined to the die pad 12. Since the die pad 12 is conductive, the lead 16 and die pad 12 are electrically connected to each other. Examples of materials for the lead 16 include the same materials as with the die pad 12.

When the semiconductor chips 14a to 14d include a MOSFET, the leads 16, 18, and 20 correspond to drain, gate, and source electrode terminals, respectively. When the semiconductor chips 14a to 14d include an IGBT, the lead 16 corresponds to a collector electrode terminal, the lead 18 corresponds to a gate electrode terminal, and the lead 20 corresponds to an emitter electrode terminal. Examples of materials for the leads 18, 20 include metals such as copper and copper alloys.

The semiconductor device 10 may comprise a wiring pattern 36 connected to the gate wirings 30a to 30d and an insulating member 38 arranged between the die pad 12 and wiring pattern 36. The wiring pattern 36 is connected to the lead 18 through a wiring 40. The insulating member 38 is interposed between the die pad 12 and wiring pattern 36 in the Z direction. The insulating member 38 is an insulating substrate or insulating layer, for example. Examples of materials for the insulating member 38 include resins such as epoxy resins and ceramics. The die pad 12, insulating member 38, and wiring pattern 36 may be bonded to one another with an adhesive.

The semiconductor device 10 may comprise a wiring pattern 42 connected to the first wirings 32a to 32d and second wirings 34a to 34d and an insulating member 44 arranged between the die pad 12 and wiring pattern 42. The wiring pattern 42 is connected to the lead 20 through a plurality of wirings 46. The insulating member 44 is interposed between the die pad 12 and wiring pattern 42 in the Z direction. The insulating member 44 is an insulating substrate or insulating layer, for example. Examples of materials for the insulating member 44 include resins such as epoxy resins and ceramics. The die pad 12, insulating member 44, and wiring pattern 42 may be bonded to one another with an adhesive. The wiring patterns 36, 42 are also called wiring bars. Examples of materials for the wiring patterns 36, 42 include the same materials as with the die pad 12.

The gate wirings 30a to 30d, first wirings 32a to 32d, second wirings 34a to 34d, and wirings 40, 46 may be wires or bonding ribbons. Examples of materials for the gate wirings 30a to 30d, first wirings 32a to 32d, second wirings 34a to 34d, and wirings 40, 46 include metals such as aluminum, gold, and copper. The gate wirings 30a to 30d, first wirings 32a to 32d, second wirings 34a to 34d, and wirings 40, 46 are connected to the wiring patterns 36, 42, semiconductor chips 14a to 14d, or leads 18, 20 by wire bonding using ultrasonic waves, pressures, or the like, for example.

The die pad 12, semiconductor chips 14a to 14d, an inner end part of the lead 18, and an inner end part of the lead 20 may be covered with a resin part 24. Inner end parts of the leads 16, 18, 20 are inserted into the resin part 24. In the leads 16, 18, 20, the parts on the inside of the resin part 24 are so-called inner lead parts. In the leads 16, 18, 20, the parts on the outside of the resin part 24 are so-called outer lead parts. An example of outer forms of the resin part 24 is a substantially rectangular parallelepiped. Examples of materials for the resin part 24 include thermoplastic resins such as polyphenylene sulfide resins (PPS resins) and liquid crystal polymers. The resin part 24 may be formed by molding the die pad 12 and semiconductor chips 14a to 14d with a thermoplastic resin. The resin part 24 is formed with a through hole 28 whose center axis aligns with that of the through hole 26 of the die pad 12. As with the through hole 26, the through hole 28 is a hole for inserting therethrough a screw or the like upon screwing, for example. The through hole 28 has a diameter smaller than that of the through hole 26.

When currents flowing through the first wirings 32a to 32d and second wirings 34a to 34d vary with time, the gate wirings 30a to 30d are susceptible to the mutual inductances received from the first wirings 32a to 32d and second wirings 34a to 34d because of the electromagnetic effect. As a result, the gate voltages of the semiconductor chips 14a to 14d fluctuate with time. The mutual inductances are determined by the distances between the gate wirings 30a to 30d and the first wirings 32a to 32d and second wirings 34a to 34d and the lengths of the parts of the gate wirings 30a to 30d opposing the first wirings 32a to 32d and second wirings 34a to 34d. As the distances between the gate wirings 30a to 30d and the first wirings 32a to 32d and second wirings 34a to 34d are shorter, the mutual inductances become greater. As the lengths of the parts of the gate wirings 30a to 30d opposing the first wirings 32a to 32d and second wirings 34a to 34d are longer, the mutual inductances become greater.

For example, the length d1 of the first part 30x of the gate wiring 30b opposing the first wiring 32b closest to the gate wiring 30b is shorter than the length d2 of the second part 30y of the gate wiring 30b opposing the second wiring 34b in the semiconductor device 10. Therefore, the gate wiring 30b is less susceptible to the mutual inductance received from the first wiring 32b because of the electromagnetic effect. Hence, the gate voltage is inhibited from fluctuating with time.

With respect to the axis Ax extending along the Y direction between the semiconductor chips 14a to 14d adjacent to each other in the semiconductor device 10, the gate wirings 30a to 30d, first wirings 32a to 32d, and second wirings 34a to 34d on one side may be arranged in the reverse of those on the other side. This uniformizes influences of the mutual inductances received by the gate wirings 30a to 30d of the semiconductor chips 14a to 14d from the first wirings 32a to 32d and second wirings 34a to 34d because of the electromagnetic effect. Hence, fluctuations in gate voltage decrease between the semiconductor chips 14a to 14d adjacent to each other.

When the semiconductor chips 14a to 14d are made of a material containing a wide bandgap semiconductor, a greater current can flow through the first wirings 32a to 32d and second wirings 34a to 34d than in the semiconductor chips 14a to 14d made of silicon. Therefore, the gate voltage tends to fluctuate more with time in the wide bandgap semiconductor, which yields a greater effect by inhibiting the gate voltage from fluctuating with time.

When the semiconductor device 10 is equipped with the wiring pattern 36 connected to the gate wirings 30a to 30d, the distances between the semiconductor chips 14a to 14d and the wiring pattern 36 can be set smaller. As a result, the gate wirings 30a to 30d can be made shorter. This makes the gate wirings 30a to 30d less susceptible to the mutual inductances received from the first wirings 32a to 32d and second wirings 34a to 34d because of the electromagnetic effect, thereby further restraining the gate voltage from fluctuating with time.

The semiconductor device 10 may comprise the leads 18, 20 and the die pad 12. This makes it hard to separate the gate wirings sufficiently from the first and second wirings. Therefore, the gate voltage tends to fluctuate more with time, whereby a greater effect is attained by inhibiting the gate voltage from fluctuating with time.

FIG. 2 is a chart illustrating an example of fluctuations in gate voltage with time in the semiconductor device in accordance with the first embodiment. FIG. 2 illustrates an example of influences of the mutual inductances received by the gate wiring 30b of the semiconductor chip 14b from the first wirings 32a to 32d and second wirings 34a to 34d. The influence from the self-inductance of the gate wiring 30b is not taken into consideration.

The current value flowing through the semiconductor chips 14a to 14d connected in parallel is 50 A. Hence, a current of 12.5 A flows through each of the semiconductor chips 14a to 14d. When the semiconductor chips 14a to 14d are in operation, the gate voltage is 15 V. The switching time is 20 ns. The length of the gate wiring 30b is 3.2 mm. The length d1 of the first part 30x of the gate wiring 30b is 2.4 mm. The length d2 of the second part 30y of the gate wiring 30b is 3.2 mm.

As the distances between the gate wiring 30b and the first wirings 32a to 32d and second wirings 34a to 34d, the shortest distances are employed. As illustrated in FIGS. 1 and 2, the shortest distances are the distances between the gate wiring 30b and points P1 to P8 on the first wirings 32a to 32d and second wirings 34a to 34d. For example, the distance between the gate wiring 30b and the point P1 on the second wiring 34a is 3.72 mm. Using this distance and the lengths d1 and d2, the mutual inductances received by the gate wiring 30b from the first wirings 32a to 32d and second wirings 34a to 34d are calculated. The fluctuation V in gate voltage is calculated by the following expression:

$$V = L \times di/dt$$

where L is the mutual inductance, i is the current, and t is the time.

FIG. 2 illustrates results of calculations of mutual inductances and fluctuations in gate voltage. For example, the mutual inductance received by the gate wiring 30b from the second wiring 34a is 0.22 nH. Its resulting fluctuation in gate voltage is 0.14 V. The total of mutual inductances received by the gate wiring 30b from the first wirings 32a to 32d and second wirings 34a to 34d is 1.81 nH. The total of fluctuations in gate voltage in the gate wiring 30b is 1.14 V (1.1 V when rounded to two significant figures). Similarly, the mutual inductances received by the gate wiring 30a from the first wirings 32a to 32d and second wirings 34a to 34d are calculated. The total of mutual inductances received by the gate wiring 30a from the first wirings 32a to 32d and second wirings 34a to 34d is 1.81 nH. The fluctuations in gate voltage in the gate wiring 30a are also calculated. The total of fluctuations in gate voltage in the gate wiring 30a is 1.1 V (when rounded to two significant figures). Hence, the gate voltage incurs the same fluctuation and thus yields no variation therein between the semiconductor chips 14a, 14b adjacent to each other.

Figure 3:
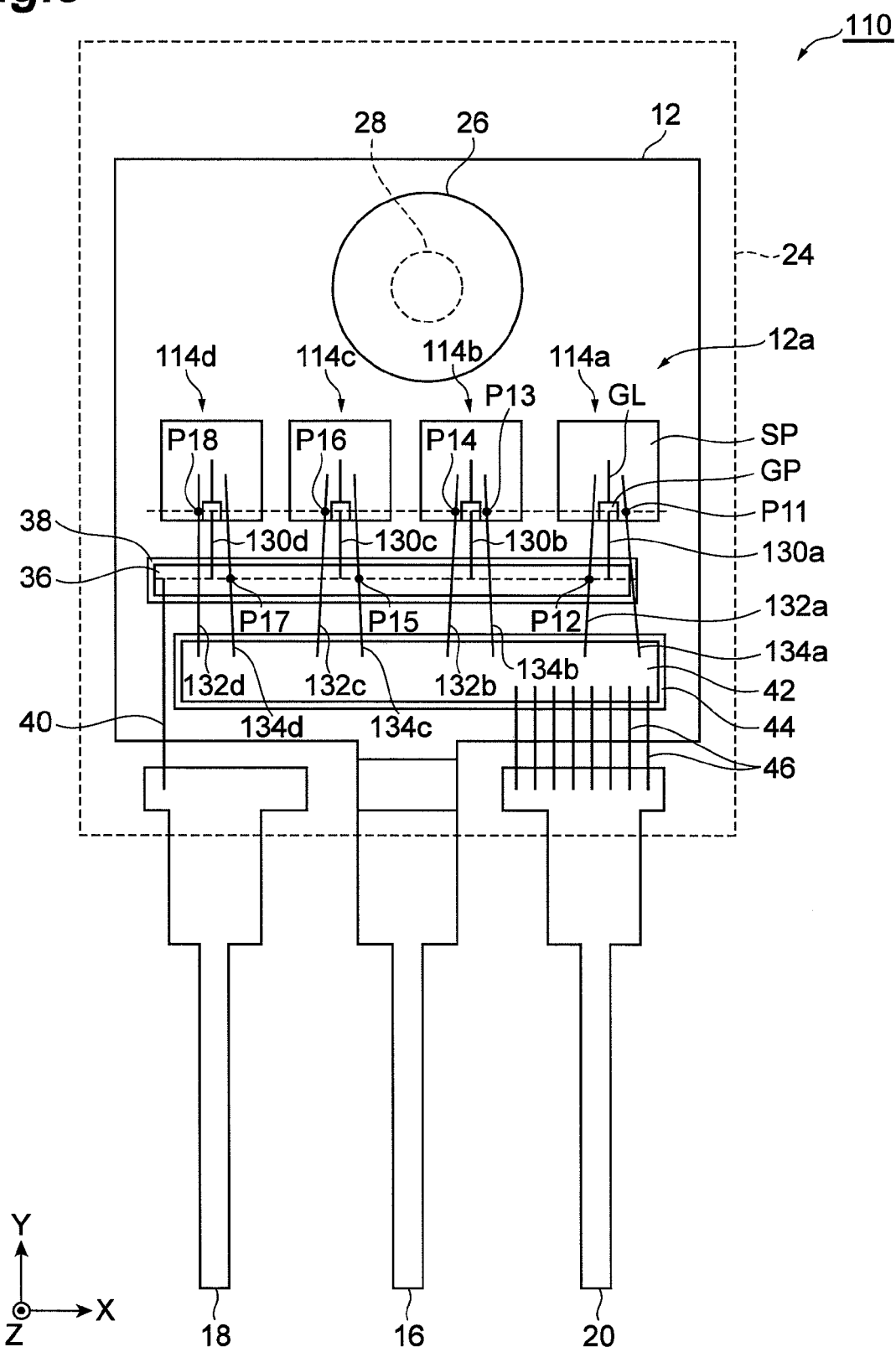

FIG. 3 is a plan view schematically illustrating a semiconductor device for reference. The semiconductor device 110 illustrated in FIG. 3 has the same structure as with the semiconductor device 10 except that it comprises semiconductor chips 114a to 114d, gate wirings 130a to 130d, first wirings 132a to 132d, and second wirings 134a to 134d in place of the semiconductor chips 14a to 14d, gate wirings 30a to 30d, first wirings 32a to 32d, and second wirings 34a to 34d.

The gate wirings 130a to 130d are arranged between the first wirings 132a to 132d and second wirings 134a to 134d. Each of parts of the gate wirings 130a to 130d opposing the first wirings 132a to 132d and second wirings 134a to 134d has the same length as with the gate wiring 130b.

FIG. 4 is a chart illustrating an example of fluctuations in gate voltage with time in the semiconductor device for reference. FIG. 4 illustrates an example of influences of mutual inductances received by the gate wiring 130b of the semiconductor chip 114b from the first wirings 132a to 132d and second wirings 134a to 134d. The influence from the self-inductance of the gate wiring 130b is not taken into consideration.

The current value flowing through the semiconductor chips 114a to 114d connected in parallel is 50 A. Hence, a current of 12.5 A flows through each of the semiconductor chips 114a to 114d. When the semiconductor chips 114a to 114d are in operation, the gate voltage is 15V. The switching time is 20 ns. The length of the gate wiring 130b is 3.2 mm. The length of the gate wiring 130b opposing the first wirings 132a to 132d and second wirings 134a to 134d is 3.2 mm.

As the distances between the gate wiring 130b and the first wirings 132a to 132d and second wirings 134a to 134d, the shortest distances are employed. As illustrated in FIGS. 3 and 4, the shortest distances are the distances between the gate wiring 130b and points P11 to P18 on the first wirings 132a to 132d and second wirings 134a to 134d. For example, the distance between the gate wiring 130b and the point P11 on the second wiring 134a is 4.54 mm. Using this distance and the length of the gate wiring 130b, the mutual inductances received by the gate wiring 130b from the first wirings 132a to 132d and second wirings 134a to 134d are calculated. FIG. 4 illustrates results of calculations of mutual inductances and fluctuations in gate voltage. For example, the mutual inductance received by the gate wiring 130b from the second wiring 134a is 0.10 nH. Its resulting fluctuation in gate voltage is 0.07 V. The total of mutual inductances received by the gate wiring 130b is 1.90 nH. The total of fluctuations in gate voltage in the gate wiring 130b is 1.19 V (1.2 V when rounded to two significant figures). Similarly, the mutual inductances received by the gate wiring 130a from the first wirings 132a to 132d and second wirings 134a to 134d are calculated. The total of mutual inductances received by the gate wiring 130a from the first wirings 132a to 132d and second wirings 134a to 134d is 1.74 nH. The fluctuations in gate voltage in the gate wiring 130a are also calculated. The total of fluctuations in gate voltage in the gate wiring 130a is 1.1 V (when rounded to two significant figures). Hence, the fluctuation in gate voltage varies by 0.1 V and thus yields a difference therein between the semiconductor chips 114a, 114b adjacent to each other.

Second Embodiment

FIG. 5 is a plan view schematically illustrating the semiconductor device in accordance with the second embodiment. The semiconductor device 10a illustrated in FIG. 5 is a semiconductor device of a case type. The semiconductor device 10a comprises semiconductor chips 14a to 14l, gate wirings 30a to 30l respectively connected to the semiconductor chips 14a to 14l, first wirings 32a to 32l respectively connected to the semiconductor chips 14a to 14l, second wirings 34a to 34l respectively connected to the semiconductor chips 14a to 14l, and a case 60. The semiconductor chips 14e, 14g, 14i, 14k may have the same structure as with the semiconductor chip 14a. The semiconductor chips 14f, 14h, 14j, 14l may have the same structure as with the semiconductor chip 14b.

The semiconductor chips 14a to 14f are disposed on a wiring pattern 52a formed on a first substrate 50a. Wiring patterns 54a, 56a may be formed on the substrate 50a. The wiring pattern 54a may be connected to the semiconductor chips 14a to 14f through the gate wirings 30a to 30f. The wiring pattern 56a may be connected to the semiconductor chips 14a to 14f through the first wirings 32a to 32f and second wirings 34a to 34f.

Similarly, the semiconductor chips 14a to 14f are disposed on a wiring pattern 52b formed on a second substrate 50b. Wiring patterns 54b, 56b may be formed on the substrate 50b. The wiring pattern 54b may be connected to the semiconductor chips 14g to 14l through the gate wirings 30g to 30l. The wiring pattern 56b may be connected to the semiconductor chips 14g to 14l through the first wirings 32g to 32l and second wirings 34g to 34l.

The case 60 may be equipped with a bottom 60a for mounting the substrates 50a, 50b. A table 60b for mounting bus bars 72a to 72c may be arranged on the bottom 60a. The bus bars 72a to 72c may be electrically connected to the semiconductor chips 14g to 14l. The case 60 may comprise a first side wall part 60c surrounding the substrates 50a, 50b and table 60b and a second side wall part 60d surrounding the first side wall part 60c. The opening of the case 60 may be sealed with a lid. Examples of materials for the case 60 include resins such as engineering plastics typified by polybutylene terephthalate (PBT) or polyphenylene sulfide (PPS) resins. Examples of materials for the lid include thermoplastic resins. For example, a gel such as silicone gel may be injected into the case 60 in order to mitigate stress. The semiconductor device 10a can attain the same operations and effects as with the semiconductor device 10.

FIG. 6 is a plan view schematically illustrating a semiconductor device for reference. The semiconductor device 110a illustrated in FIG. 6 has the same structure as with the semiconductor device 10a except that it comprises semiconductor chips 114a to 114l, gate wirings 130a to 130l, first wirings 132a to 132l, and second wirings 134a to 134l in place of the semiconductor chips 14a to 14l, gate wirings 30a to 30l, first wirings 32a to 32l, and second wirings 34a to 34l.

The gate wirings 130a to 130l are arranged between the first wirings 132a to 132l and second wirings 134a to 134l. Each of parts of the gate wirings 130a to 130l opposing the first wirings 132a to 132l and second wirings 134a to 134l has the same length as with the gate wiring 130b.

The present invention is not limited to the preferred embodiments explained in detail in the foregoing.

For example, the semiconductor device 10, 10a may include only one semiconductor chip. The semiconductor device 10, 10a may comprise a third wiring connected to the semiconductor chip.

The semiconductor chips 14a to 14l may include lateral transistors in place of vertical transistors. In this case, no electrode pad is formed on the rear faces of the semiconductor chips 14a to 14l, while different electrode pads such as drain electrode pads and collector electrode pads, for example, are formed on the front faces of the semiconductor chips 14a to 14l.

The semiconductor device 10 may be free of the wiring patterns 36, 42. In this case, the gate wirings 30a to 30d are connected to the lead 18. The first wirings 32a to 32d and second wirings 34a to 34d are connected to the lead 20.

What is claimed is:

1. A semiconductor device comprising:
   at least one semiconductor chip;
   a gate wiring connected to the at least one semiconductor chip;
   a first wiring connected to the at least one semiconductor chip; and
   a second wiring connected to the at least one semiconductor chip;
   wherein the first and second wirings extend along the gate wiring;
   wherein the first wiring is arranged between the gate wiring and second wiring;
   wherein the first wiring is the wiring closest to the gate wiring;
   wherein a first part of the gate wiring opposing the first wiring is shorter than a second part of the gate wiring opposing the second wiring;
   wherein the at least one semiconductor chip comprises a plurality of semiconductor chips;
   wherein the plurality of semiconductor chips are arranged along a first direction; and
   wherein, with respect to an axis extending along a second direction perpendicular to the first direction between the semiconductor chips adjacent to each other, the gate wiring, first wiring, and second wiring on one side are arranged in the reverse of those on the other side.

2. The semiconductor device according to claim 1, wherein the at least one semiconductor chip is made of a material containing a wide bandgap semiconductor.

3. The semiconductor device according to claim 1, further comprising a wiring pattern connected to the gate wiring.

4. The semiconductor device according to claim 1, further comprising:
   a first lead electrically connected to the gate wiring;
   a second lead electrically connected to the first and second wirings; and
   a die pad having a chip mount surface for mounting the at least one semiconductor chip.

* * * * *